United States Patent
Li et al.

(10) Patent No.: US 8,504,308 B2
(45) Date of Patent: Aug. 6, 2013

(54) SYSTEM AND METHOD FOR FATIGUE ANALYSIS OF A BOTTOM HOLE ASSEMBLY

(75) Inventors: Ke Li, Missouri City, TX (US); Srinand Karuppoor, Sugar Land, TX (US); Sepand Ossia, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 451 days.

(21) Appl. No.: 12/835,281

(22) Filed: Jul. 13, 2010

(65) Prior Publication Data
US 2012/0016589 A1  Jan. 19, 2012

(51) Int. Cl.
*G01B 3/44* (2006.01)

(52) U.S. Cl.
USPC ............. 702/34; 702/9; 702/104; 702/105; 702/189

(58) Field of Classification Search
USPC ............. 703/2, 6; 702/9, 104, 105, 189, 34; 73/152.01, 804; 33/302, 304
See application file for complete search history.

(56) References Cited

U.S. PATENT DOCUMENTS

| | | | |
|---|---|---|---|
| 4,409,824 A | | 10/1983 | Salama et al. |
| 5,134,783 A | * | 8/1992 | Perry ............................... 33/645 |
| 5,517,464 A | | 5/1996 | Lerner et al. |
| 6,532,825 B1 | | 3/2003 | Abe |
| 6,641,434 B2 | | 11/2003 | Boyle et al. |
| 6,866,306 B2 | | 3/2005 | Boyle et al. |
| 7,150,479 B2 | * | 12/2006 | Benedict et al. .............. 285/333 |
| 7,225,879 B2 | * | 6/2007 | Wylie et al. ................... 166/380 |
| 7,413,021 B2 | | 8/2008 | Madhavan et al. |
| 8,014,987 B2 | * | 9/2011 | Pabon et al. ..................... 703/10 |
| 2004/0221985 A1 | | 11/2004 | Hill et al. |
| 2008/0255817 A1 | | 10/2008 | Pabon et al. |
| 2008/0319720 A1 | | 12/2008 | Ellis et al. |
| 2009/0166087 A1 | | 7/2009 | Braden et al. |
| 2011/0186353 A1 | * | 8/2011 | Turner et al. .................... 175/40 |

FOREIGN PATENT DOCUMENTS

WO   WO2007086998   8/2007

OTHER PUBLICATIONS

Hill, Tom et al., An Innovative Design Approach to Reduce Drill String Fatigue, SPE 87188, Dallas, Texas, March 204, 2004.
Tipton, S.M. et al., Fatigue Integrity Analysis of Rotating Coiled Tubing, SPE 100068, The Woodlands, Texas, Apr. 4-5, 2006.

* cited by examiner

*Primary Examiner* — Elias Desta
(74) *Attorney, Agent, or Firm* — Chadwick A. Sullivan

(57) ABSTRACT

A system and a method analyze fatigue damage of a bottom hole assembly ("BHA"), and more specifically, use a multi-scale approach for fatigue analysis of a BHA. Three length scales may be used in modeling of a BHA, namely the BHA scale, the component scale and the feature scale. Loading conditions for each collar/tool of the BHA may be determined, such as by use of a beam model, and may be applied to the finite element models for the collar/tool to determine the fatigue damage of each fatigue susceptible feature of each collar/tool. A cumulative fatigue damage of each critical feature may be determined, and the weakest component of the BHA may be identified. Prognostic and diagnostic implementation with well survey and drilling data may monitor fatigue damage of critical components of the BHA.

18 Claims, 12 Drawing Sheets

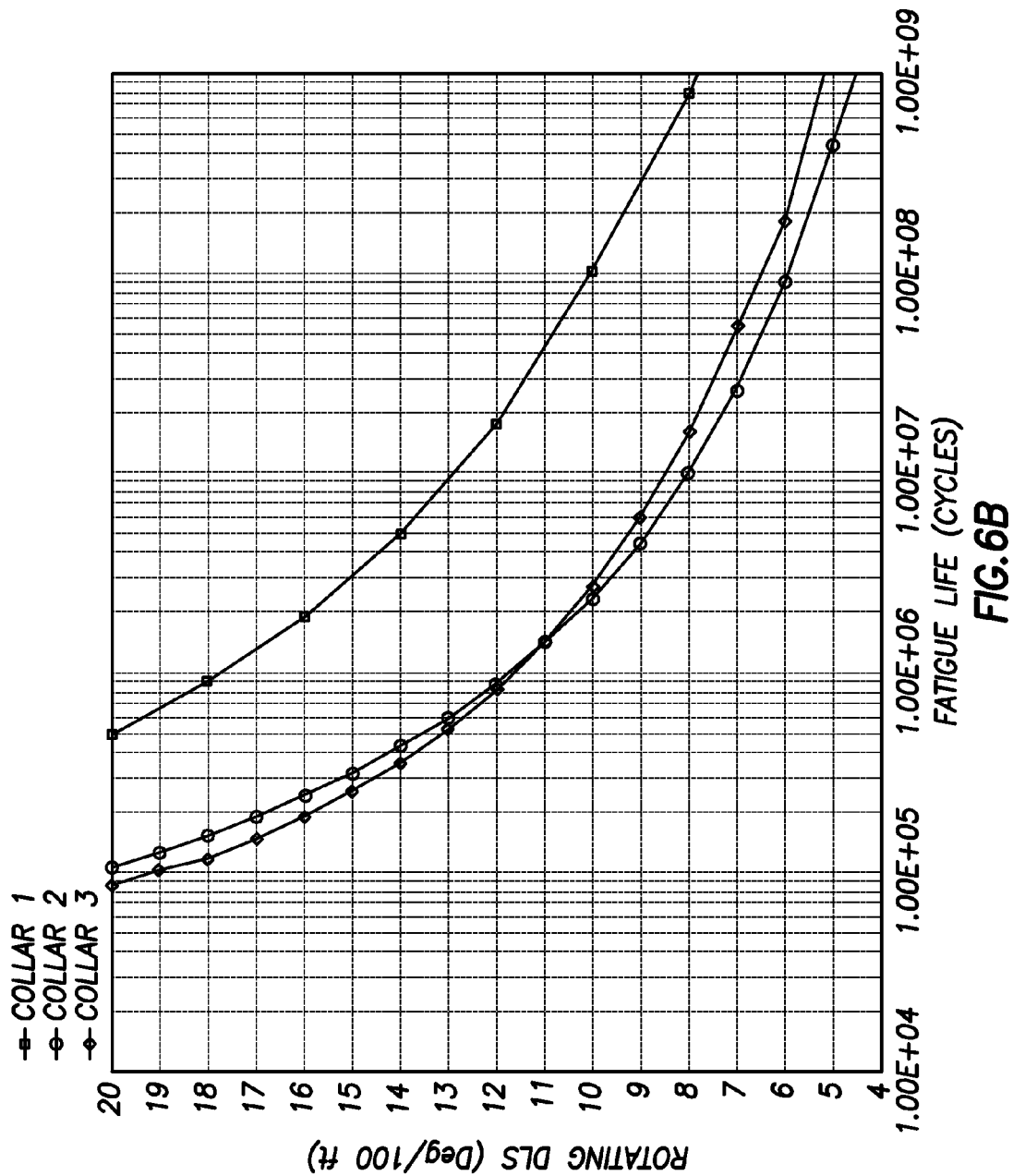

FIG.9A

FatigueCalculator
File  Help

BHA Configuration
BHA:BHA
Use This BHA

Job Parameters
Job Number: 123
DAte: 03/12/2009
GeoMarket: US
Location: ABC
Client: XYZ
Lead Engineer: engineer

| Description | ID | OD | Length | Serial # | Feature | History | Life |
|---|---|---|---|---|---|---|---|
| NM DC | 2.81 | 6.5 | 30 | 123 | 4 1/2 IF Box | 4% | 96% |
| | | | | | 4 1/2 IF Pin | 5% | 57% |
| Flex Sub | 2.94 | 6.75 | 11 | 234 | 4 1/2 IF Pin | 11% | 21.4% |
| | | | | | 4 1/2 IF Box | 12% | 49% |
| Stab | 2.88 | 8.625 | 6.48 | 345 | 4 1/2 IF Pin | 2% | 59% |
| | | | | | 4 1/2 IF Pin | 2% | 6% |
| Sub | 2.75 | 6.75 | 6.0 | 456 | 4 1/2 IF Box | 115 | 29.5% |
| | | | | | 4 1/2 IF Pin | 0% | 1.1% |
| Monel | 3.2 | 6.75 | 3.1 | 648 | 4 1/2 IF Box | 4% | 19.2% |
| | | | | | 4 1/2 IF Pin | 2% | 4.6% |
| RSS | 5.04 | 6.88 | 6.66 | 12 | 5 1/2 FH Box | 0% | 0.1% |
| | | | | | 4 1/2 REG Box | 0% | 0% |
| 8 3/4 in Bit | 0 | 8.5 | .75 | 12 | 4 1/2 REG Pin | 0 | 0% |

NMDC
Flex Sub
Stab
Sub
NMDC
BHA
RSS
Bit

BHA Selected | Serial Numbers Complete | History Complete | Drilling Data Entered Drilling Data

Job Information

Drilling Data | Revs per DLS

| Depth | Inc | Azm | DLS | ROP (ft/hr) | RPM | Cumulative RPM | Elapsed Time (min) |
|---|---|---|---|---|---|---|---|
| 200 | 0.57 | 101.32 | 0.4 | 10 | 90 | 108000 | 1200 |
| 300 | 0.41 | 99.13 | 0.2 | 10 | 93 | 54000 | 600 |
| 400 | 0.12 | 106.47 | 0.3 | 12 | 93 | 65800 | 600 |
| 500 | 0.27 | 101.32 | 0.2 | 11 | 94 | 46500.000000000007 | 600.00000000000006 |
| 600 | 0.49 | 99.13 | 0.2 | 12 | 94 | 51272.727272727279 | 545.45454545455 |
| 700 | 0.36 | 104.39 | 0.1 | 12 | 94 | 47000.000000000007 | 600.00000000000006 |
| 800 | 0.59 | 101.51 | 0.2 | 12 | 94 | 47000.000000000007 | 600.00000000000006 |

☑ Compute DLS from Inclination and Azimuth

[Clear] [Import Drilling Data] [Close]

*FIG. 9B*

SYSTEM AND METHOD FOR FATIGUE ANALYSIS OF A BOTTOM HOLE ASSEMBLY

BACKGROUND

The present disclosure generally relates to a system and a method for fatigue analysis of a bottom hole assembly.

To obtain hydrocarbons, a drilling tool is driven into the ground surface to create a wellbore through which the hydrocarbons are extracted. Typically, a drill string is suspended within the wellbore. The drill string has a drill bit at a lower end of sections of drill pipe. The drill string extends from the surface to the drill bit. The drill string has a bottom hole assembly ("BHA") located proximate to the drill bit.

The BHA has drill collars housing one or more tools, such as measuring devices, power supplies, motors, stabilizers or the like. Drill collars provide weight on the drill bit for control and penetration of the drill bit. The drill collars are connected to each other by threaded connections. Port holes in the drill collar may be used for various purposes.

Fatigue is a cause of drill pipe and drill collar failures. Port holes, dimension changes, such as external radii, and threaded connections are susceptible to fatigue-induced failures. Consequently, an accurate estimation of the fatigue life of a weakest component of the BHA is beneficial for proper planning for and reliable completion of drilling operations. In addition, an accurate estimation of the fatigue life enables design changes which enhance fatigue resistance of the weakest component in the BHA. The fatigue life of a component is usually defined as the total number of cycles to initiate a dominant crack and to propagate this dominant flaw to final failure.

The fatigue damage process may be described as the nucleation and growth of cracks to final failure. The evolution of permanent damage under cyclic deformation, and the nucleation and the propagation of a fatigue crack involve the microstructural length scale. However, phenomenological continuum approaches are widely used to characterize the total fatigue life as a function of controlling parameters, such as, for example, the applied stress range, the strain range, the mean stress, and the environment. The stress-based method and the strain-based method address the damage evolution, the crack nucleation and the crack growth stages of fatigue using a single experimentally characterizable continuum formulation.

Fatigue design is usually undertaken based on the similitude concept. The behavior of small-scale material specimens under cyclic test with carefully controlled conditions is related to the likely performance of real structures subjected to variable amplitude fatigue loads under either simulated or actual service conditions. The commonly used approaches for fatigue life prediction include stress life approach, strain life approach and crack growth life approach. The stress life approach is suitable for infinite life or high-cycle finite life applications due to its incapability of capturing notch plasticity. Prediction of the crack growth life using fracture mechanics approaches utilizes accurate determination of the initial crack size which may be difficult. Another limitation of the crack growth life approach is the difficulty in accounting for complex sequence effects. The strain life approach is better suited for fatigue analysis of structures with finite fatigue lives because the strain life approach captures effects due to complicated load sequences.

Nevertheless, fatigue is a complex process. Numerous factors may affect the fatigue life of a structure, such as, for example, cyclic stress states, geometry, surface quality, material type, residual stresses, size and distribution of internal defects, grain size, environment and temperature. Consequently, given the large uncertainties associated with fatigue life predictions, a realistic fatigue analysis approach benefits from using conservative parameters to enable consistent comparative analysis of different components of a BHA.

BRIEF DESCRIPTION OF THE DRAWINGS

FIG. 6B illustrates a display of rotating dog-leg severity vs. fatigue life according to one or more aspects of the present disclosure.

FIG. 9 illustrates a user interface for BHA fatigue damage tracking according to one or more aspects of the present disclosure

DETAILED DESCRIPTION OF THE PRESENTLY PREFERRED EMBODIMENTS

Figure 1:
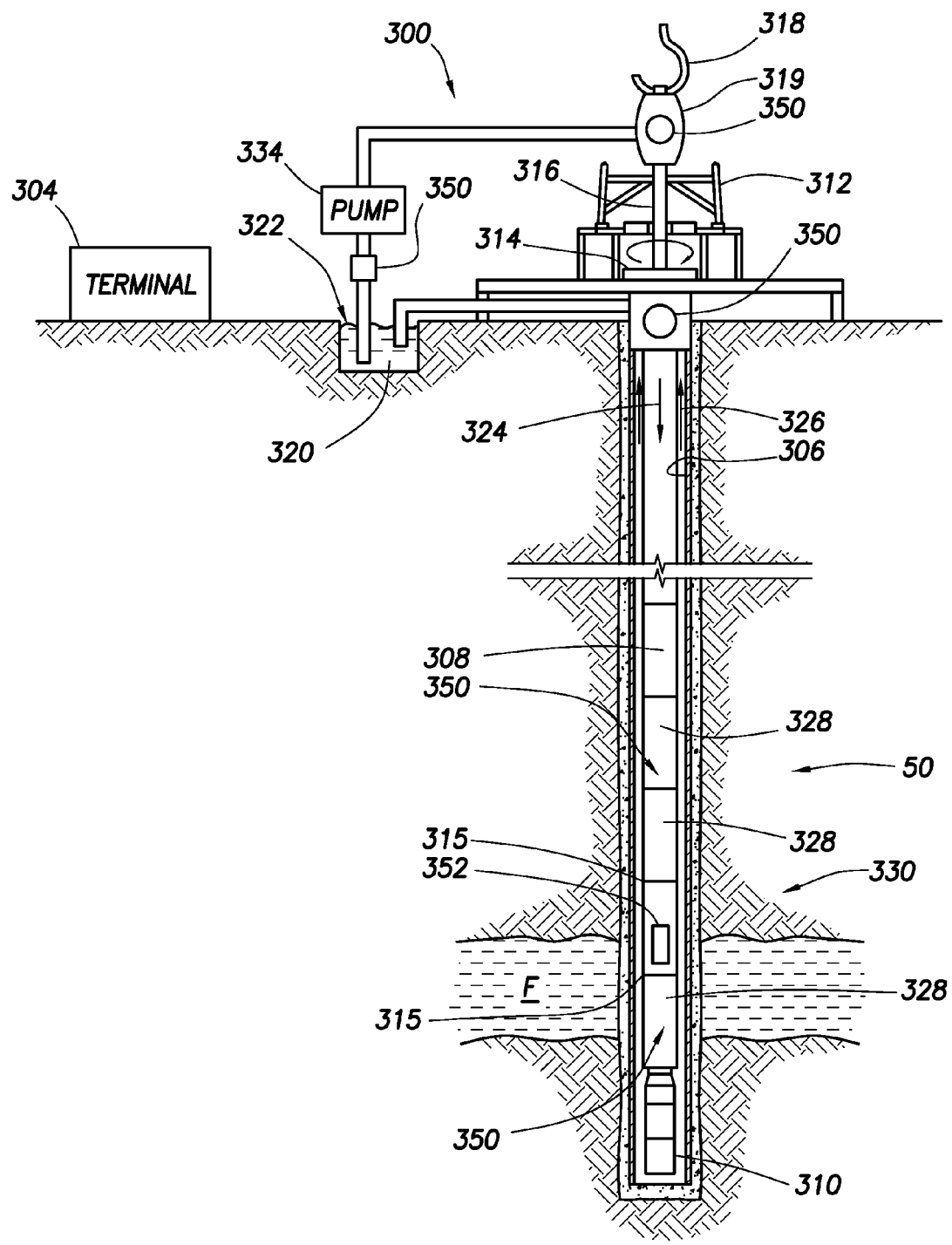
FIG. 1 illustrates a system for fatigue analysis of a bottom hole assembly ("BHA") according to one or more aspects of the present disclosure.

The present disclosure generally relates to a system and a method for performing fatigue analysis of a bottom hole assembly ("BHA"). More specifically, the present disclosure relates to a multi-scale approach for performing fatigue analysis of a BHA. Corrective action may be taken based on the fatigue analysis. The system and the method may use three length scales in modeling of a BHA, namely a BHA scale, a component or tool scale and a feature or fatigue susceptible feature. At the BHA level, the system and the method may generate a model, such as, for example, a beam-type finite element model, using BHA information and drilling parameters as inputs. At the component level, the system and the method may use the calculated shear force, contact force, and bending moment as loading conditions for models, such as, for example, continuum element-based finite element models. The system and the method may employ a fatigue criterion based on the stress life approach, the strain life approach, the energy life approach, or the crack propagation approach and a proper mean stress correction method. The system and the method may also utilize given values of alternating strain, mean stress and/or the fatigue properties of the materials to compute the fatigue damage. Based on the analysis of stress and/or fatigue properties at the component level, a fatigue life or fatigue damage of each fatigue susceptible feature may be determined.

The bending moment-fatigue damage relation is intrinsic to each fatigue susceptible feature (or critical feature used interchangeably) of the BHA, such as, for example, dimension changes of the BHA, portholes and/or threaded connections. The term dimension changes of the BHA is used herein to mean any change in the size of the BHA, such as an increase or decrease in radius as measured from the center of the BHA to an external surface. Typically, the change in dimension involves having a radius of curvature along the dimension change on an external side or an internal side of the BHA. The system and the method may translate the bending moment-fatigue damage relation into the dog-leg severity-fatigue damage relation using the dog-leg severity-bending moment relation established from the BHA model. Based on the damage of a fatigue susceptible feature calculated for a given dog-leg severity, the system and the method may use Miner's Rule to compute the total fatigue damage of the fatigue susceptible features for all the dog-legs in which the BHA has been exposed. The system and the method may identify one or more of the fatigue susceptible features having the shortest remaining fatigue life and/or generate fatigue damage in order to take a corrective action, such as halting the drilling process, changing a drilling parameter, replacing the component having the fatigue susceptible feature, repairing the fatigue susceptible feature or the like. In an embodiment of the invention, the fatigue analysis may lead to design changes of the BHA.

Referring now to the drawings wherein like numerals refer to like parts, FIG. 1 generally illustrates a BHA fatigue analysis system 50 (hereinafter "the system 50") for fatigue analysis of a BHA 330. A drilling operation may be conducted at a wellsite 300. The wellsite 300 may have a wellbore 306 formed by drilling and/or penetrating a subsurface formation F.

The system 50 may have a terminal 304. The terminal 304 may be, for example, a desktop computer, a laptop computer, a mobile cellular telephone, a personal digital assistant ("PDA"), a 4G mobile device, a 3G mobile device, a 2.5G mobile device, a satellite radio receiver and/or the like. The terminal 304 preferably has a processor for processing data received by the terminal 304. The terminal 304 may be located at the surface and/or may be remote relative to the wellsite 300. The present disclosure is not limited to a specific embodiment or a specific location of the terminal 304, and the terminal 304 may be any device that has a capability to be used in the system 50. Any number of terminals may be used to implement the system 50, and the present disclosure is not limited to a specific number of terminals.

The system 50 may have a drill string 308 suspended within the wellbore 306, and a drill bit 310 may be located at the lower end of the drill string 308. The system 50 may have a land-based platform and derrick assembly 312 positioned over the wellbore 306. The assembly 312 may have a rotary table 314, a kelly 316, a hook 318 and/or a rotary swivel 319. The drill string 308 may be rotated by the rotary table 314 which engages the kelly 316 at the upper end of the drill string 308. The drill string 308 may be suspended from the hook 318 and the rotary swivel 319 to rotate relative to the hook 318.

Drilling fluid 320 may be stored in a reservoir 322 formed at the wellsite 300. A pump 334 may deliver the drilling fluid 320 to the interior of the drill string 308 through a port in the rotary swivel 319 to induce the drilling fluid 320 to flow downward through the drill string 308 as indicated by directional arrow 324. The drilling fluid 320 may exit the drill string 308 through ports (not shown) in the drill bit 310, and then circulate upward through the annulus as indicated by the directional arrows 326. Thus, the drilling fluid 320 may lubricate the drill bit 310 and may carry formation cuttings up to the surface as the drilling fluid 320 returns to the reservoir 322 for recirculation.

The drill string 308 has the BHA 330 proximate to the drill bit 310. The BHA 330 may have one or more tools for measuring, processing and/or storing information and/or communicating with the terminal 304. Additionally, the BHA 330 may have mud motors, rotary steerable assemblies and/or reamers which may divert a portion of the drilling fluid 320 to the annulus. The one or more tools of the BHA 330 may be mechanically connected to and/or located on drill collars 328. Threaded connections 315 may connect the drill collars 328 to each other.

Sensors 350 at various locations at the wellsite 300 may collect data, preferably in real-time, concerning the operation and the conditions of the wellsite 300. The sensors 350 may have image generation capabilities. One or more of the sensors 350 may be sensors which may provide information about surface conditions, such as, for example, drilling fluid pressure, hookload, depth, surface torque, rotary rpm and/or the like. One or more of the sensors 350 may be downhole sensors and/or may be disposed within the wellbore 306 to provide information about downhole conditions, such as, for example, wellbore pressure, weight on bit, torque on bit, direction, inclination, collar rpm, tool temperature, annular temperature, toolface, along-string measurements and/or the like. One or more of the sensors 350 may measure vibrations, axial movement, stress, strain and/or the like of one or more of the drill collars 328. The information obtained by the sensors 350 may be transmitted to various components of the system 50, such as, for example, the terminal 304.

The BHA 330 may have a communication subassembly 352 that communicates with the terminal 304. The communication subassembly 352 may be adapted to send signals to and receive signals from the terminal 304 using any type of telemetry known to those having ordinary skill in the art, including mud pulse telemetry, wired drill pipe telemetry, electromagnetic telemetry, and acoustic telemetry. The communication subassembly 352 may have a transmitter that generates a signal, such as, for example, an acoustic or electromagnetic signal, which is representative of the measured drilling parameters. Communication between the downhole and surface systems is depicted as being mud pulse telemetry, such as the system described in U.S. Pat. No. 5,517,464 assigned to the assignee of the present disclosure and incorporated by reference in its entirety. However, as mentioned, any other telemetry may be used. In addition, combinations of two or more telemetries may be used simultaneously, such as in parallel or in series. For example, mud pulse telemetry may be used in conjunction with or as backup for wired drill pipe as described hereafter.

Wired drill pipe telemetry may comprise communicatively coupled joints to form the drill string 308. The wired drill pipe may provide a signal communication conduit communicatively coupled at each end of each of the wired drill pipe joints. For example, the wired drill pipe preferably has an electrical and/or optical conductor extending at least partially within the drill pipe with inductive couplers positioned at the ends of each of the wired drill pipe joints. The wired drill pipe enables communication of the data from the downhole sensors to the terminal 304. Examples of wired drill pipe that may be used in the present disclosure are described in detail in U.S. Pat. Nos. 6,641,434 and 6,866,306 to Boyle et al. and U.S. Pat. No. 7,413,021 to Madhavan et al. and U.S. Patent App. Pub. No. 2009/0166087 to Braden et al., assigned to the assignee of the present application and incorporated by reference in their entireties. The present disclosure should not be deemed as limited to a specific embodiment of the wired drill pipe telemetry system, or any type of telemetry system.

The wellbore 306 may be drilled according to a drilling plan established prior to drilling. The drilling plan typically sets forth equipment, pressures, trajectories and/or other parameters that define the drilling process for the wellsite 300. The drilling operation may be performed according to the drilling plan. However, as the information is obtained, the drilling operation may need to deviate from the drilling plan. As drilling or other operations are performed, the subsurface conditions may change. The earth model may also require adjustment as new information is collected.

Further, simulations of the drilling equipment may be made. The results of the simulations may be used to alter operating parameters, such as, for example, rate of penetration, trajectory, casing locations, a composition or rate of flow of the drilling fluid 320 transported through the drill string 308 and/or the speed at which the drill bit 310 rotates. Other changes may be made to the drilling operations to optimize the drilling operations, such as, for example, changing components in the drill string 308, such as the BHA 330 and/or the drill bit 310. Optimizations of the drilling operations may be, for example, the speed at which the wellbore 306 is created, or rate of penetration, a dog leg severity or trajectory and/or the amount of time which different components in the drill string 308 are used. Examples of simulations that may be used in the present disclosure are described in detail in U.S. Patent App. Pub. No. 2008/0255817 to Pabon et al., assigned to the assignee of the present application and incorporated by reference in its entirety.

Figure 2:
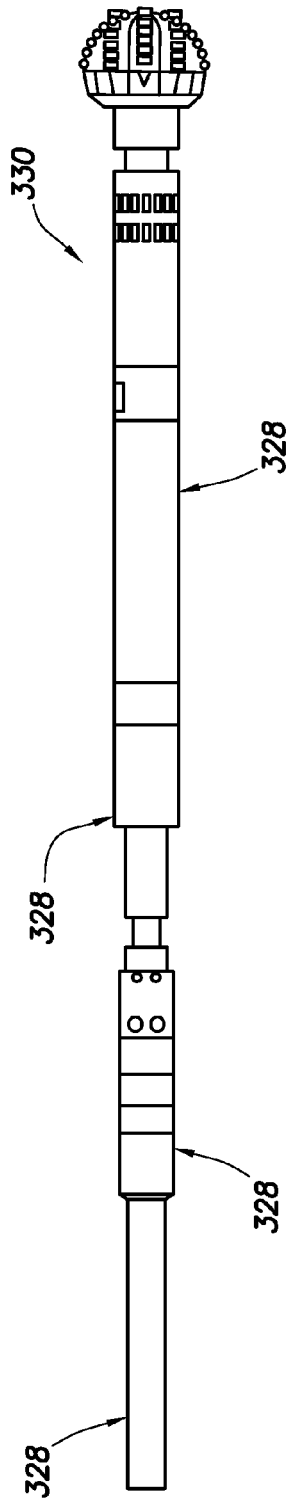
FIG. 2 illustrates a BHA according to one or more aspects of the present disclosure.

FIG. 2 generally illustrates the BHA 330 having drill collars 328 which may be connected by threaded connections 315. Each of the drill collars 328 may or may not have internal components. Port holes (not shown) may be positioned in the drill collars 328 for many purposes, such as providing communication access to a tool or device within one of the drill collars 328. Each of the threaded connections 315 may transfer loads, such as, for example, bending moment, torque, axial force and/or the like. With respect to fatigue, fatigue susceptible features of the BHA 330 may be dimension changes of the BHA 330, such as external curvatures or radii, the port holes in the drill collars 328 and/or the threaded connections 315. Each of the fatigue susceptible features may be associated with one of the drill collars 328, and the fatigue of each of the fatigue susceptible features may be determined and monitored as discussed in detail hereafter.

Figure 3:
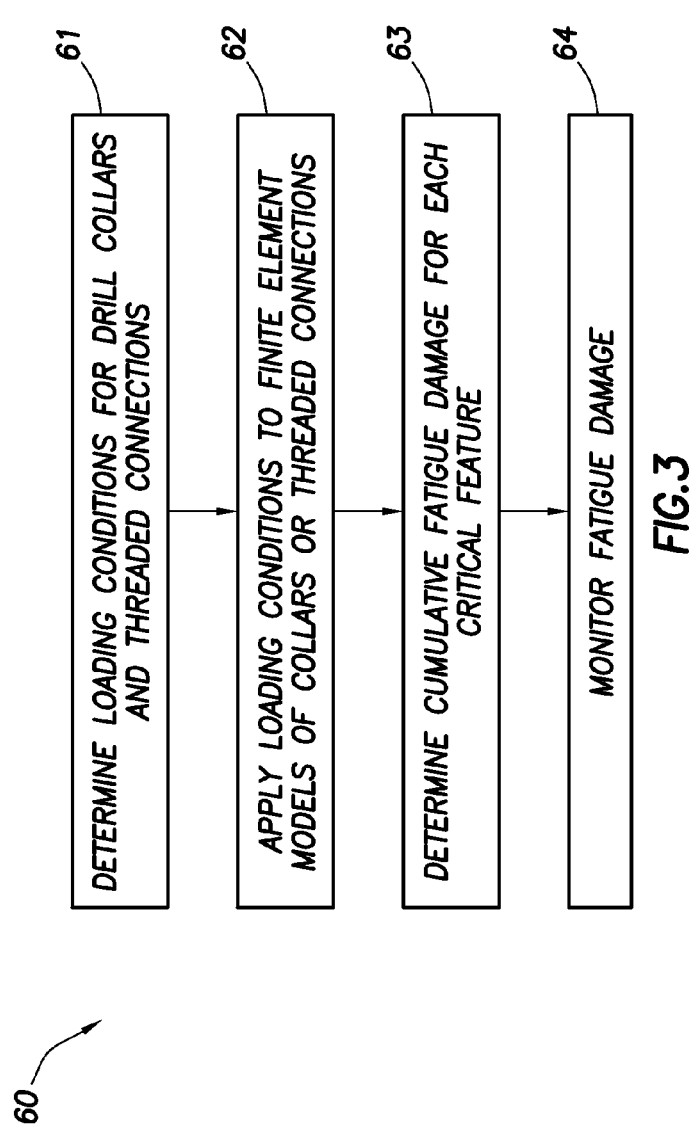
FIG. 3 illustrates a method for fatigue analysis according to one or more aspects of the present disclosure.

FIG. 3 generally illustrates a method 60 for fatigue analysis of the BHA 330. Computer readable medium, such as, for example, a compact disc, a DVD, a computer memory, a hard drive and/or the like, may enable the terminal 304 to perform the method 60 and/or be used in the system 50. In step 61, the terminal 304 may determine loading conditions for each component or tool of the BHA 300. The loading conditions may be or may include bending moment, shear force, contact force, pad force, formation modulus, coefficient of friction, weight on bit, torque on bit, hydrostatic pressure and/or other forces on the BHA 330.

The loading conditions may be based on estimated drilling conditions and/or real-time measurements, such as, for example, measurements transmitted from the BHA 330 and/or the sensors 350. For example, the terminal 304 may estimate loading conditions of each of the fatigue susceptible features of the BHA 330 before drilling commences using information regarding the BHA 330, such as a composition of material of components of the BHA 330, positions and locations of components and fatigue susceptible features of the BHA 330, spatial relationship between fatigue susceptible features, and known or measured fatigue damage, and stress and strain histories of the drill collars or other components of the BHA 330. In addition, the loading conditions may be estimated using information from the drilling plan, such as the trajectory or the dog-leg severity, the revolutions per minute and/or the like. Then, during drilling, the terminal 304 may use real-time data to update and/or re-calculate the estimated fatigue damage of each of the fatigue susceptible features of the BHA 330. The actual conditions encountered during drilling by each of the fatigue susceptible features of the BHA 330 may differ from the estimated conditions provided by the well plan, and continuous updating of the fatigue damage using the real-time data may provide more accurate values for the fatigue damage as drilling proceeds.

To determine the loading conditions for the collar and threaded connections of the BHA 330 in step 61, the terminal 304 may consider the BHA 330 as a one-dimensional model comprised of a number of beams, and each of the beams may represent one of the drill collars 328 or a section of one of the drill collars 328. The terminal 304 may treat a section of one of the drill collars 328 with substantially invariable bending stiffness as one beam. If one of the drill collars 328 has internal components, the terminal 304 may perform finite element analysis on one of the drill collars 328 and the internal components to determine effective bending stiffness of the one of the drill collars 328. Alternatively, the terminal 304 may use a previously measured bending stiffness and/or a previously computed bending stiffness of the one of the drill collars 328, such as, for example, a bending stiffness based on previous application of one or more bending moments and measurement of the resulting deflection of the component and/or a bending stiffness determined by previous finite element analysis on the component.

Figure 4:
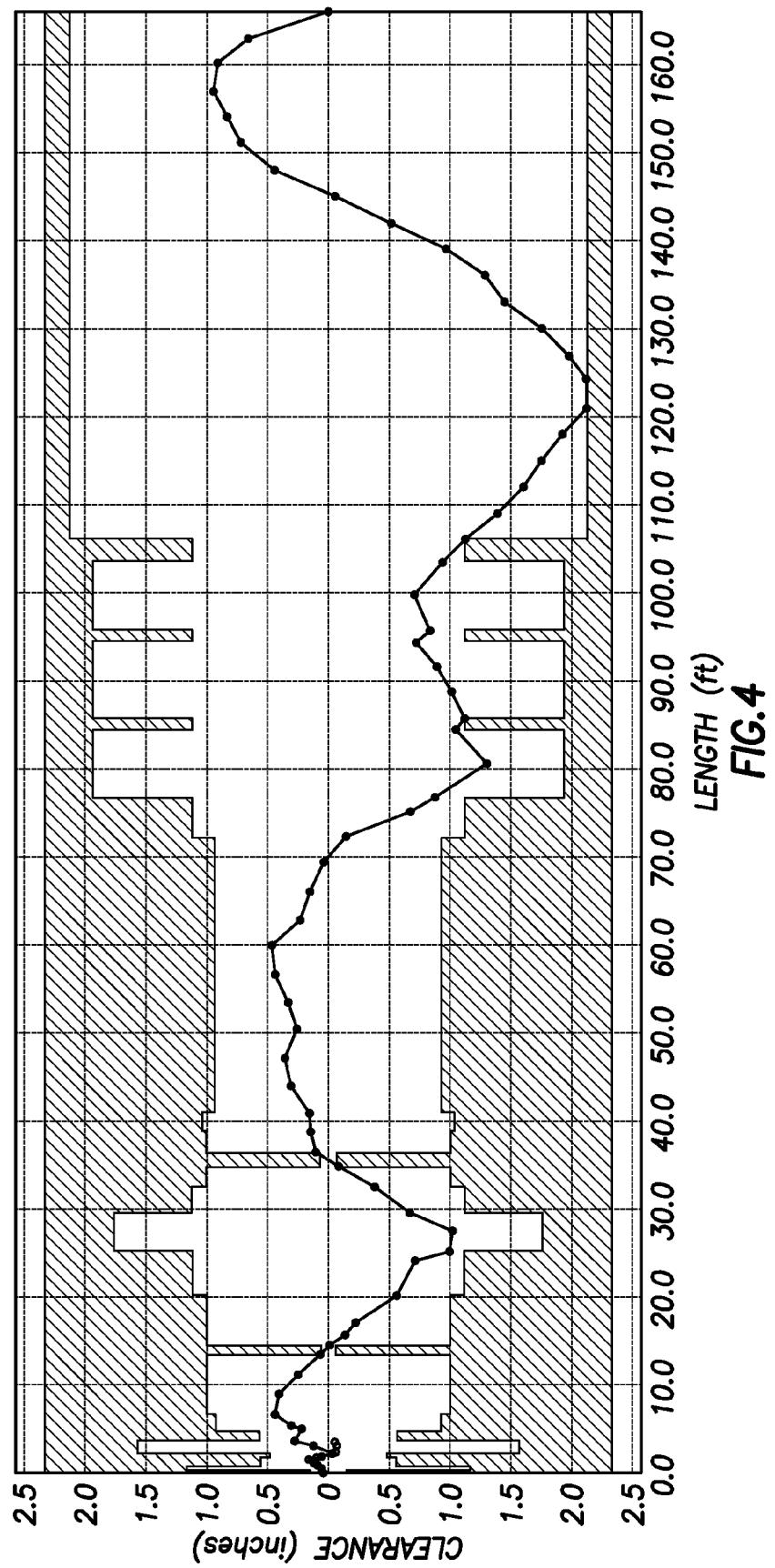
FIG. 4 illustrates a display of clearances between nodes of a BHA and the wellbore according to one or more aspects of the present disclosure.

Input for the one-dimensional finite element model may be well curvature/dog-leg severity, revolutions per minute, depth, torque on bit, weight on bit, pad force, formation modulus, coefficient of friction, borehole size measured by a caliper or other device, and/or the like. In an embodiment, the input may include real-time data, such as, for example, measurements transmitted from the BHA 330 and/or the sensors 350. The terminal 304 may use characterized contact stiffness between the stabilizers and the formation surrounding the BHA 330. The terminal 304 may use the characterized contact stiffness with the Hertzian contact which may be provided by the formation modulus. Output relevant to subsequent feature analysis may be, for example, bending moment, contact force and/or shear force at each node joining two beams. The terminal 304 may use the output to determine the clearance between each node and the wellbore 306. For example, the clearance may be determined based on the wellbore diameter, the node position and the tool outer diameter at the node position. The terminal 304 may compare the computed clearance with real-time measurements of the clearance, such as, for example, caliper measurements. As shown in FIG. 4, the terminal 304 may use the clearance to display the location of the contact points of the BHA 330 at a given time.

In step 62 of FIG. 2, the terminal 304 may apply the output from step 61, such as, for example, the bending moment, the contact force and/or the shear force, to a selected drill collar of the drill collars 328 to predict the stress/strain states at the fatigue susceptible features of the selected drill collar. Alternatively, the terminal 304 may use experimental results and/or pre-computations of stress/strain states of the fatigue susceptible features of the selected drill collar. The fatigue susceptible features may be, for example, the port holes associated with the selected drill collar, one or more threaded connections 315 associated with the selected drill collar and/or the changes in radius associated with the selected drill collar. Additional loads enforced may be, for example, weight on bit, torque on bit, and/or hydrostatic pressures. The terminal 304 may model each of the threaded connections 315 with an axi-symmetric approximation, and a special finite element capable of experiencing asymmetric loading may be used. The make-up torque may be converted to an axial preload, and the axial preload may be transferred into a shoulder interference.

For each of the drill collars 328 and/or each of the threaded connections 315, the terminal 304 may use a bending moment corresponding to a rated/specified rotating dog-leg severity for the computations. For example, in an embodiment, the terminal 304 may utilize pre-computations based on twenty equally spaced load increments to provide a sufficient number of datum points on the bending moment-fatigue life relation. Accordingly, each of the load increments in the pre-computations may represent one-twentieth of the total bending moment applied.

Figure 5A:
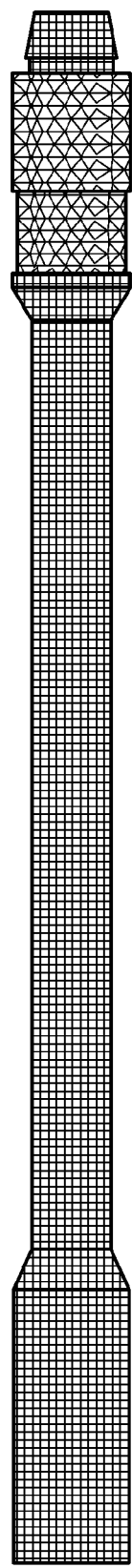
FIG. 5A illustrates a finite element mesh for a drill collar with critical radii according to one or more aspects of the present disclosure.
Figure 5B:
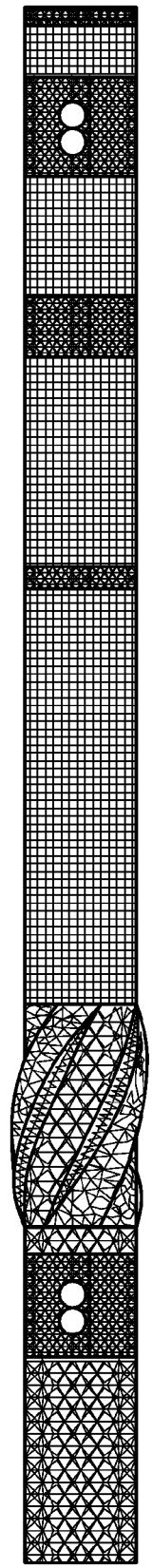
FIG. 5B illustrates a finite element mesh for a drill collar with critical port holes according to one or more aspects of the present disclosure.
Figure 5C:
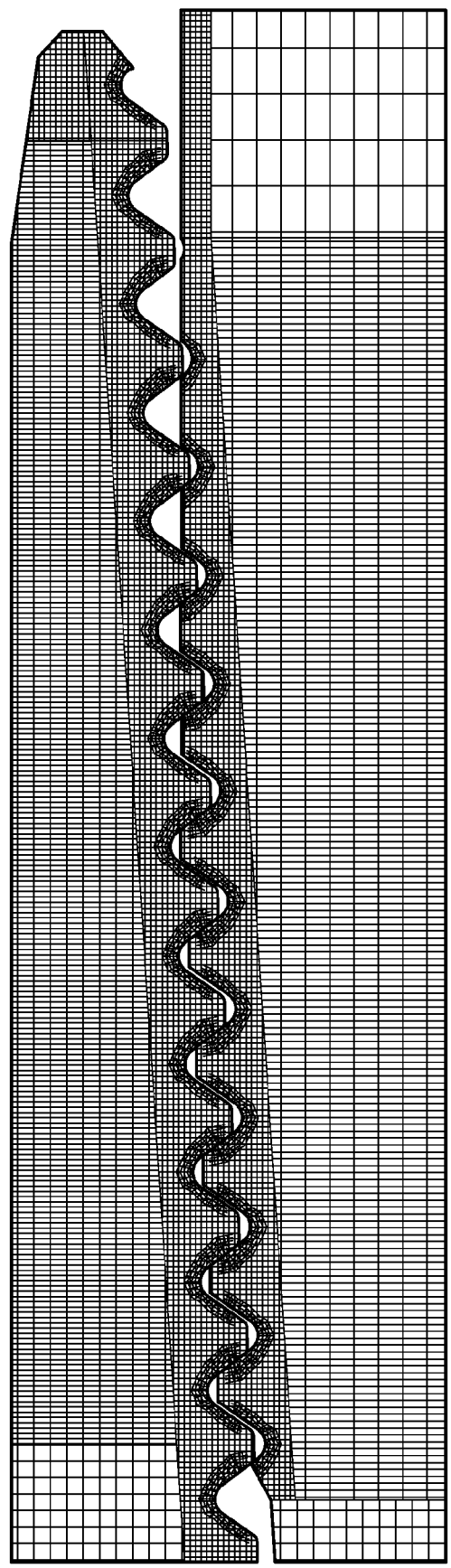
FIG. 5C illustrates a finite element mesh for a threaded connection according to one or more aspects of the present disclosure.

The terminal 304 may predict the fatigue life for each of the drill collars 328, each male end of the threaded connections 315 and/or each female end of the threaded connections 315. As generally shown in FIG. 5A, the terminal 304 may display the finite element mesh of one of the drill collars 328 having critical radii, such as two external radii corresponding to a dimensional change in the BHA 330. As generally shown in FIG. 5B, the terminal 304 may display the finite element mesh of one of the drill collars 328 having port holes. As generally shown in FIG. 5C, the terminal 304 may display the finite element mesh of one of the threaded connections 315.

In an embodiment, the terminal 304 may use the maximum principal strain fatigue criterion with the Morrow mean stress correction to predict the fatigue life of the fatigue susceptible features of the BHA 330 in step 61 of FIG. 2. The effects of drilling parameters on fatigue life may be described as follows:

$$\Delta\epsilon/2=((\sigma'_F-\sigma_m)/E)(2N_f)^b+\epsilon'_f(2N_f)^c,$$

$\Delta\epsilon=\Delta\epsilon$ (rotating DLS), and $\sigma_m=\sigma_m$(WOB, TOB, pressure).

Figure 6A:
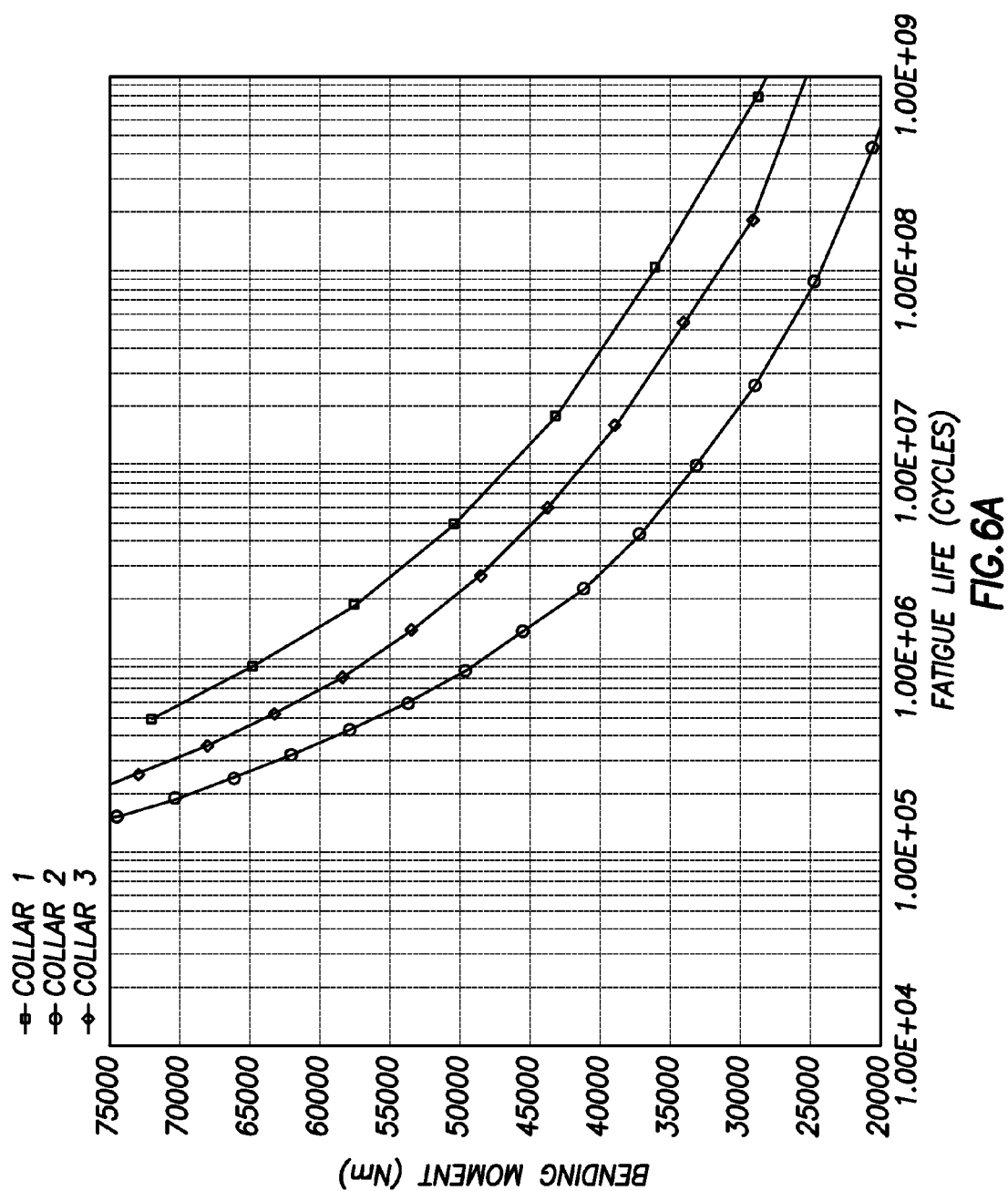
FIG. 6A illustrates a display of bending moment vs. fatigue life according to one or more aspects of the present disclosure.

In step 63, the terminal 304 may convert the bending moment-fatigue life relation into the rotating dog-leg severity-fatigue life relation by use of the bending moment-rotating dog-leg severity relation computed for the BHA 330, the wellbore 306 and/or the formation F in step 61. For example, the bending moment-fatigue life relation depicted in FIG. 6A may be converted into the rotating dog-leg severity-fatigue life relation depicted in FIG. 6B. The rotating dog-leg severity-fatigue life relation may be of ultimate interest to tool designers and tool operators. The terminal 304 may determine the dog-leg severity-fatigue life relation for each male end of the threaded connections 315 and/or each female end of the threaded connections 315 of the BHA 330. The terminal 304 may determine the weakest component by comparing the rotating dog-leg severity-fatigue life relations of the fatigue susceptible features, such as, for example, the portholes, the threaded connections 315 and/or the dimensional changes of the BHA 330, such as a radius of curvature on an external side of a drill collar.

In step 63 of FIG. 2, the terminal 304 may determine a cumulative fatigue damage of each fatigue susceptible feature and/or may identify the weakest component of the BHA 330. The real-time data may be used to continuously update the fatigue damage of the fatigue susceptible features of the BHA 330. The fatigue damage based on the real-time data and determined during drilling may be more accurate relative to the estimated fatigue damage determined before drilling using the parameters from the drilling plan. For example, the BHA 330 typically experiences different dog-leg severity values during use relative to the estimated dog-leg severity values based on parameters from the drilling plan. Moreover, each of the fatigue susceptible features may experience different dog-leg severity values during use relative to the other fatigue susceptible features. Accordingly, the terminal 304 may implement real-time tracking of fatigue damage of the fatigue susceptible features of the BHA 330 based on input from real-time data, such as, for example, drilling conditions and the bending moment-fatigue life relations intrinsic to the fatigue susceptible features.

The total fatigue damage may be determined in step 63 using the dog-leg severity vs. revolutions per minute relation and the dog-leg severity vs. fatigue life relation. The dog-leg severity vs. revolutions per minute relation may be determined using time, measured depth, revolutions per minute and dog-leg severity determined in step 61. The dog-leg severity vs. fatigue life relation may be determined in step 63 using the bending moment vs. fatigue life relation obtained from applying the loading conditions to the finite element model in step 62 and the dog-leg severity vs. bending moment relation determined in step 61. Relations between hourly fatigue damage and rotating dog-leg severity with varied revolutions per minute values may be used to design the BHA 330 as discussed hereafter.

Figure 7:
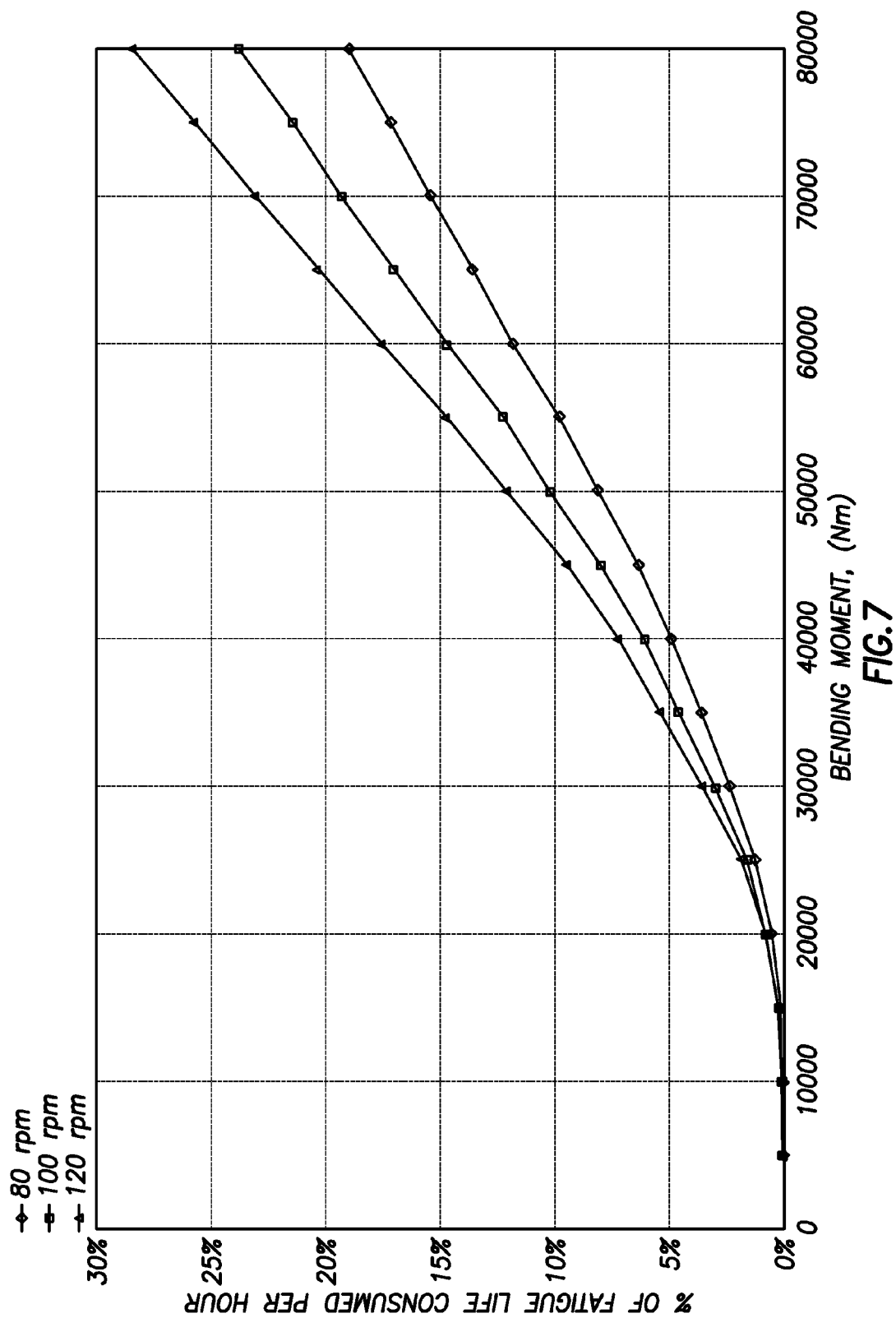
FIG. 7 illustrates a display of hourly fatigue damage at given revolutions per minute and bending moment according to one or more aspects of the present disclosure.

The hourly fatigue damage for the threaded connections 315 may vary as a function of revolutions per minute and bending moment. The terminal 304 may use Palmgren-Miner's rule to determine the total fatigue damage experienced by a fatigue susceptible feature of the BHA 330 during use. Palmgren-Miner's rule may establish when failure would Occur. As generally illustrated in FIG. 7, the terminal 304 may display a chart depicting that the hourly fatigue damage invoked in a threaded connection varies as a function of revolutions per minute and bending moment. The chart represents the intrinsic failure resistance of each of the threaded connections 315. The terminal 304 may translate the chart into relations between hourly fatigue damage and rotating dog-leg severity with varied revolutions per minute values by using the rotating dog-leg severity-bending moment relations from the analysis of the BHA 330 in step 61.

As noted previously, the terminal 304 may identify the weakest component of the BHA 330 in step 63. For example, referring again to FIG. 6A, the bending moment-fatigue life relations of three collars of a BHA are graphically illustrated. Each curve depicted is characteristic of the fatigue resistance of the corresponding drill collar. In the specific example shown in FIG. 6A, the first drill collar is the strongest drill collar, the third drill collar is the second strongest drill collar, and the second drill collar is the third strongest drill collar.

As discussed previously, the terminal 304 may convert the bending moment-fatigue life relation into the rotating dog-leg severity-fatigue life relation by use of the bending moment-rotating dog-leg severity relation computed for the BHA 330, the wellbore 306 and/or the formation F. The fatigue life curves of the first collar, the second collar and the third collar are plotted in FIG. 6B based on use of the bending moment-rotating dog-leg severity relation. In the specific example shown in FIG. 6B, at a specific value of rotating dog-leg severity, the first collar is the strongest collar, and the second collar and the third collar have similar fatigue resistance.

In step 64 of FIG. 2, the terminal 304 may use the cumulative fatigue damage to provide prognostic and diagnostic implementation with well survey and drilling data to monitor fatigue damage of critical components of the BHA 330. For example, the terminal 304 may implement real-time tracking of fatigue damage of the fatigue susceptible features of the BHA 330 based on input from real-time data, such as, for example, drilling conditions and the bending moment-fatigue life relations intrinsic to the fatigue susceptible features. In addition, the drilling operations may be adjusted to optimize fatigue life in response to the real-time data. For example, the dog-leg severity, the weight on bit, the torque on bit, the pressure, the revolutions per minute and/or the like may be adjusted based on a current cumulative fatigue damage of one or more of the fatigue susceptible features of the BHA 330.

The system 50 and the method 60 may be applied to design components of the BHA 330 for specified long-life application and/or to perform pre-job planning to ensure that the BHA 330 will complete the planned operations. For example, changes in material and/or features of components of the BHA 330 and/or the sequence in which the components are ordered in the BHA 330 may be performed prior to use of the BHA 330 to improve fatigue life. Accordingly, pre-job planning and prognosis of the fatigue life may be based on estimated job parameters to optimize the BHA 330 against fatigue damage. Such optimization may maintain the capabilities of the BHA 330 at a higher level and/or for a longer amount of use under the expected job conditions relative to a BHA 330 which is not optimized. In addition, the system 50 and the method 60 may enable planning of drilling operations and monitoring the cumulative fatigue damage of the components of the BHA 330. The system 50 and the method 60 may determine the number of revolutions experienced by each fatigue susceptible feature at a given dog-leg severity value based on the drilling parameters used. Drilling operations may be planned and/or may be adjusted such that the fatigue initiation life is not consumed by each of the fatigue susceptible features of the BHA 330, such as, for example, radii, portholes and/or threaded connections 315 of the drill collars 328.

For example, as the fatigue damage of the BHA 330 and/or a component of the BHA 330 increases, corrective action may be taken. The terminal 304 may automatically implement the corrective action and/or the corrective action may be based on user input to the terminal 304. The corrective action may be based on the information, such as, for example, the real-time data, obtained by the sensors 350 and/or transmitted to the terminal 304. The corrective action may be an adjustment of drilling operations. For example, the corrective action may be adjustment of the dog-leg severity, the weight on bit, the torque on bit, the pressure, the revolutions per minute and/or the like.

The corrective action may be to interrupt the drilling, use a different BHA for the reminder of the job, and re-machine the BHA 330 for a future job. Re-machining the BHA 330 may involve, for example, performing a recut and/or adding compressive residual stresses that mitigate fatigue damage. The compressive residual stresses may be added by shot peening, roller burnishing and/or the like. For example, if the cumulative fatigue damage approaches and/or reaches unity, a recut may be performed on one or more of the fatigue susceptible features before a dominant crack develops. The recut may remove the persistent slipping bands near the surface of the fatigue susceptible feature to provide a new surface to experience fatigue excursions. The system 50 and the method 60 may determine the depth of the recut and/or the compressive residual stresses using finite element analysis. A minimal volume of material may be removed by the recut, but preferably the volume of material removed should ensure that the new surface experienced minimal fatigue damage previously. As a result, the fatigue life of the BHA 330 may be extended by monitoring the damage history of the fatigue susceptible features and performing recuts on the fatigue susceptible features.

Figure 8:
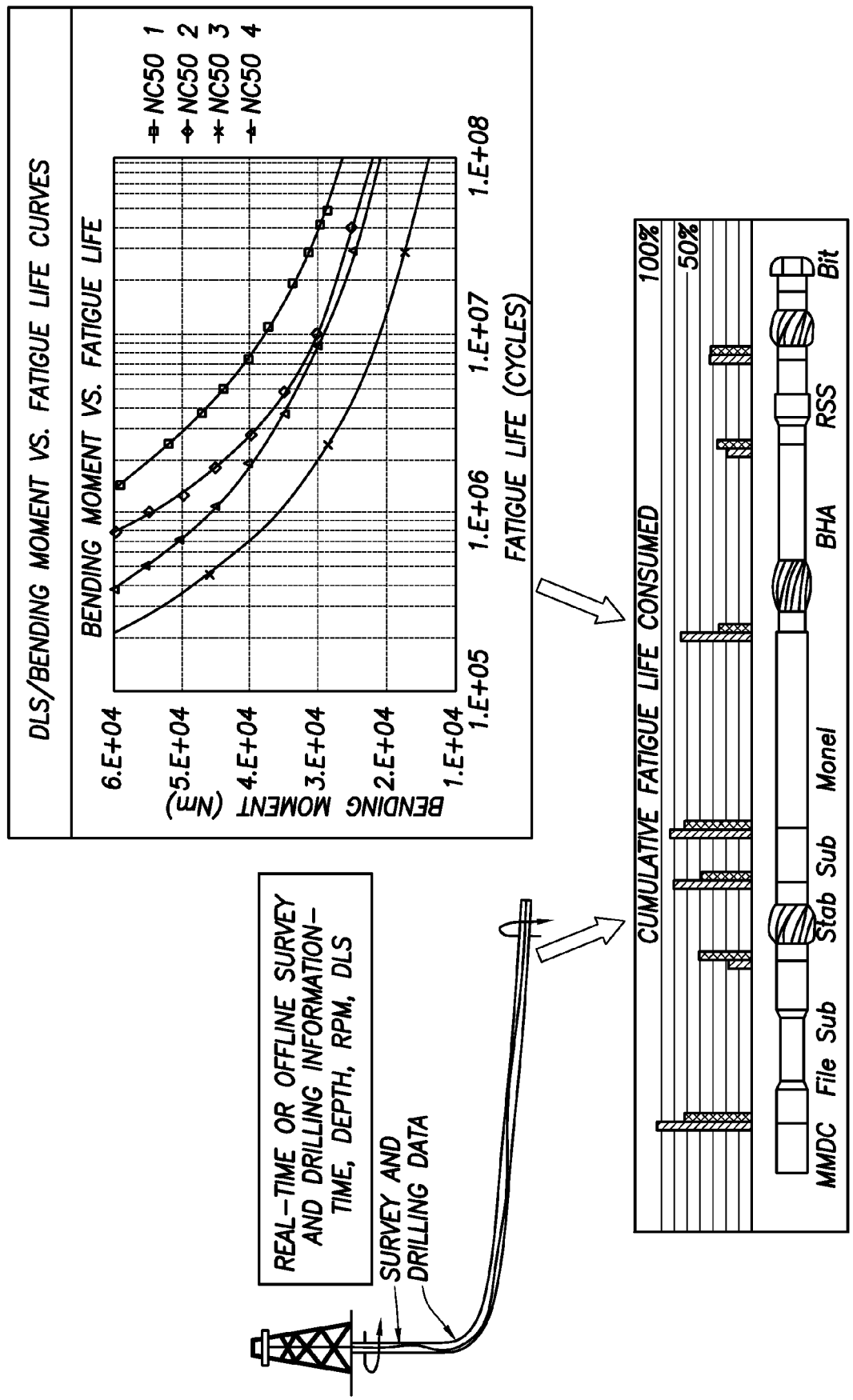
FIG. 8 illustrates a schematic of the BHA fatigue life calculation tool according to one or more aspects of the present disclosure.

The terminal 304 may implement real-time tracking of fatigue damages experienced by the fatigue susceptible features of the BHA 330 based on input from real-time data, such as, for example, drilling conditions and the bending moment-fatigue life relations intrinsic to the fatigue susceptible features. As shown in FIG. 8, the terminal 304 may compute and display the cumulative damage of each fatigue susceptible feature, such as, for example, portholes, threaded connections 315 of the drill collars 328 and/or dimensional changes of the BHA 330, such as those having external radii, in real-time. If one of the fatigue susceptible features expends the corresponding fatigue initiation life and/or the fatigue damage of a fatigue susceptible feature reaches a predetermined threshold, the drilling operation may be stopped, corrective action may be taken and/or a recut may be performed for the fatigue susceptible feature before the tool that has the fatigue susceptible feature is reused. Accordingly, the system 50 and the method 60 may provide real-time optimization of the drilling operations to minimize fatigue damage for the BHA 330 and/or components of the BHA 330.

The terminal 304 may compute the fatigue damage for each of the fatigue susceptible features based on the input, and the terminal 304 may store, may accumulate, may display, may arrange and/or may organize damage results. As shown in FIG. 9, the terminal 304 may have a user interface 20 for data entry, data display and/or file operations. The user interface 20 may have a first interface 21 that displays fatigue damage for each of the fatigue susceptible features and/or a second interface 22 that displays job information. The BHA 330 may be configured by a user of the terminal 304, and the user may provide information used by the terminal 304, such as, for example, component names, component dimensions, serial number, damage histories and/or the like. In an embodiment, survey results and drilling parameters may be entered using the second interface 22 of the user interface 20. The damage history of each component of the BHA 330 may be tracked with an identifier associated with each component, such as, for example, a serial number.

Accordingly, fatigue damage may be monitored for a component used in a first BHA such that the fatigue damage for the component from the previous use in the first BHA is the starting point for the fatigue damage of the component for use in the second BHA. For example, a selected drill collar may incur 50% fatigue damage during use in a first BHA. Subsequently, the drill collar may be used in a second BHA, and the terminal 304 may use 50% fatigue damage as the starting point for monitoring fatigue damage of the selected drill collar during use in the second BHA.

Moreover, fatigue damage may be monitored for a BHA and/or a component of BHA in a first borehole such that the fatigue damage for the BHA and/or the component from the previous use in the first borehole is the starting point for the fatigue damage of the BHA and/or the component for use in the second borehole. For example, a selected drill collar may incur 40% fatigue damage during use in a first borehole. Subsequently, the drill collar may be used in a second borehole, and the terminal 304 may use 40% fatigue damage as the starting point for monitoring fatigue damage of the selected drill collar during use in the second borehole.

Relevant computations which may be implemented in step and/or step 62 in an embodiment of the method 60 are discussed in detail hereafter. In an embodiment, the terminal 304 may use the strain life approach to compute the fatigue damage. In the strain life approach, the strain or deformation may be directly measured and quantified using the elastic component and the plastic component of the total strain amplitude. Application of the strain life approach may require a description of the material response to cyclic elasto-plastic strains, which are the elastic and plastic strains resulting from cyclic loads. Further, application of the strain life approach may require a relationship between the cyclic elasto-plastic strains and the fatigue endurance of the component. The terminal 304 may determine the fatigue life using a local strain approach which utilizes a sequence of local strains which may be measurements of the actual strain. The local strain approach may be useful in practical fatigue investigations where strains may be measured using strain gauges.

Alternatively, the terminal 304 may determine the fatigue life using a sequence of nominal strains, which may be a range of expected values of strain, and strain concentration factors. The local strain approach may have wider application in fatigue design relative to calculation of fatigue life using a sequence of nominal strains and strain concentration factors because finite element models may provide local strains and local stresses. Calculation of fatigue life using a sequence of nominal strains and strain concentration factors may be limited similar to the stress life approach in that the strain concentration factor is highly sensitive to the type of material used and the geometry and the size of a notch formed in a component in the BHA 330 because of fatigue. Nevertheless, the system and the method are not limited to the strain life approach and are also applicable to the stress life approach, the energy life approach and the crack propagation life approach.

When a smooth test specimen is cycled between fixed strain limits, the stress response in initial cycles may indicate that the material of the specimen is softening to produce lower stresses for each strain cycle or hardening to produce higher stresses for each strain cycle. After the initial cycles, the maximum stress amplitudes stabilize, and, as a result, the hysteresis stress-strain loops stabilize. As shown in FIG. 10A, using different strain limits results in different hysteresis stress-strain loops whose tips lie on the cyclic stress-strain curve. The cyclic stress-strain relation may be described by the Ramberg and Osgood equation as follows:

$$\epsilon=(\sigma/E)+(\sigma/K')^{1/n'},$$

where $\epsilon$ is strain; $\sigma$ is stress; E is the cyclic elastic modulus, which may be taken to be the same as the monotonic elastic modulus because these modulii are typically approximately the same; K' is the cyclic hardening coefficient; and n' is the cyclic hardening exponent.

Figure 10B:
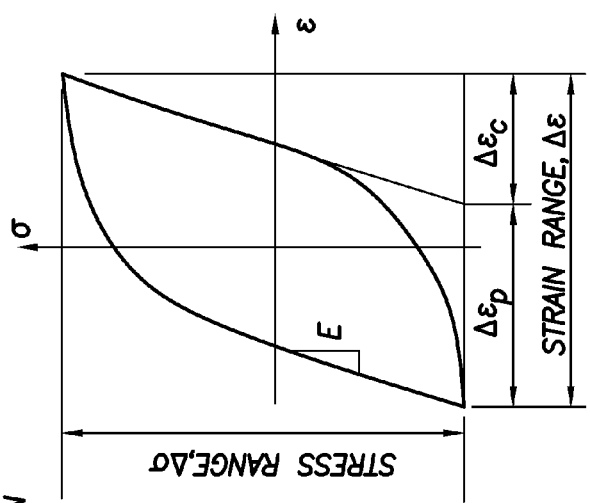
FIG. 10B is a schematic illustration of a separation of the total strain into an elastic component and a plastic component according to one or more aspects of the present disclosure.
Figure 10A:
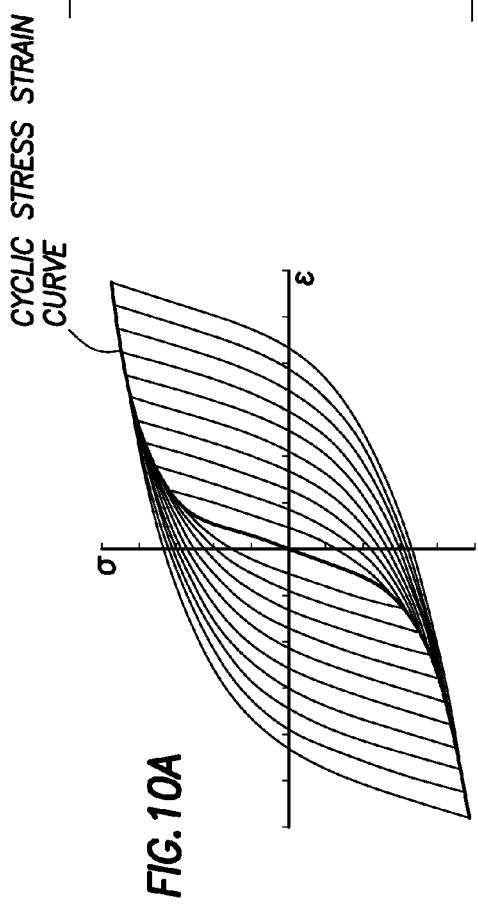
FIG. 10A is a schematic illustration of a hysteresis loop and cyclic stress strain curve according to one or more aspects of the present disclosure.

As shown in FIG. 10B, the terminal 304 may separate the total strain for each stabilized hysteresis loop corresponding to a given strain limit into an elastic component and a plastic component. The terminal 304 may plot the elastic strain in log-log scales as shown in FIG. 10C, and the elastic strain may exhibit a linear variation with life which may be described with Basquin's equation as follows:

$$\Delta\epsilon_e/2=(\sigma'_f/E)(2N_f)^b,$$

where $N_f$ is the number of reversals (half cycles); $\sigma'_f$ is the fatigue strength coefficient; b is the fatigue strength exponent; and use is made of $\Delta\epsilon_e=\Delta\sigma/E$.

Figure 10C:
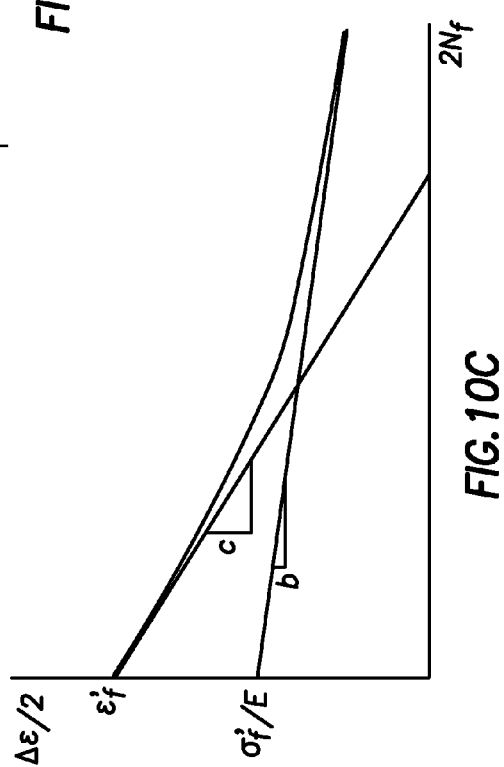
FIG. 10C is a schematic illustration of strain-life relations according to one or more aspects of the present disclosure.

As shown in FIG. 10C, the log-log plot of plastic strain vs. life shows a linear variation which may be expressed as follows:

$$\Delta\epsilon_p/2=\epsilon'_f(2N_f)^c,$$

where $\epsilon'_f$ is the fatigue ductility coefficient and c is the fatigue ductility exponent.

The total strain is the summation of the elastic strain and the plastic strain, namely:

$$\Delta\epsilon=\Delta\epsilon_e+\Delta\epsilon_p \text{ and } \Delta\epsilon/2=\Delta\epsilon_e/2+\Delta\epsilon_p/2.$$

The terminal 304 may substitute Basquin's equation and the relation of plastic strain vs. life into the summation of the elastic strain and the plastic strain to yield the Coffin-Manson equation, namely:

$$\Delta\epsilon/2=(\sigma'_f/E)(2N_f)^b+\epsilon'_f(2N_f)^c.$$

The terminal 304 may use the Coffin-Manson equation with strain controlled fatigue testing to determine the fatigue properties.

To account for the effect of mud temperature on the fatigue strength of the collar materials, the terminal 304 may utilize strain controlled fatigue testing with elevated temperature. The effect of surface finish may be incorporated by correcting the fatigue strength exponent using the following equation:

$$b_s=(-\log(\sigma'_F/k_s\sigma_e))/(\log(2N_f)),$$

where $k_s$ is the surface finish correction factor and $\sigma_e$ is the endurance limit in smooth material.

Accordingly, the system 50 and the method 60 may use three length scales, the BHA 330 length scale, the component scale, and the fatigue susceptible feature scale. At the BHA 330 scale, a one-dimensional beam model of the BHA 330 may be generated to determine the loading conditions of each of the drill collars 328 and/or other components of the BHA 330 at each of a plurality of dog-leg severities. At the component or drill collar 328 scale, an analysis, such as a finite element analysis, may be performed to determine the stresses or strains at each of the fatigue susceptible features of the BHA 330. The system 50 and the method 60 may determine the cumulative fatigue damage of each fatigue susceptible feature and may identify the weakest component of the BHA 330. For example, the relationships based on the length scales above may result in a computation of fatigue damage per revolution of the fatigue susceptible feature. Measuring a number of revolutions at each dog-leg severity can yield a cumulative fatigue damage of the fatigues susceptible feature. The system 50 and the method 60 may monitor fatigue damage of critical components of the BHA 330 from use in a first wellbore to subsequent uses in other wellbores.

It should be understood that various changes and modifications to the presently preferred embodiments described herein will be apparent to those having ordinary skill in the art. Such changes and modifications may be made without departing from the spirit and scope of the present disclosure and without diminishing its attendant advantages. It is, therefore, intended that such changes and modifications be covered by the claims.

The following is claimed:

1. A method for fatigue analysis of a bottom hole assembly ("BHA") comprised of a plurality of drill collars threadedly connected, the method comprising:
   obtaining, during drilling operations, measurements by sensors connected with the BHA;
   receiving the measurements at a terminal;
   generating, using the terminal, a beam model of the bottom hole assembly to determine loading conditions of at least one of the plurality of drill collars at a first dog-leg severity of a wellbore;
   performing, using the terminal, a finite element analysis of the one of the plurality of drill collars to determine the stresses or strains at a fatigue susceptible feature of the at least one of the plurality of drill collars at the first dog leg severity;
   determining, using the terminal, fatigue damage of the fatigue susceptible feature at the first dog-leg severity and at each other dog-leg severity of the wellbore; and
   determining, using the terminal, the cumulative fatigue damage of the fatigue susceptible feature by summing the fatigue damage at each dog-leg severity.

2. The method of claim 1, wherein the fatigue damage is calculated by determining, using the terminal, fatigue damage per revolution of the fatigue susceptible feature at the first dog-leg severity.

3. The method of claim 2, wherein the measurements obtained by sensors at the BHA include a number of revolutions of the fatigue susceptible feature at the first dog-leg severity.

4. The method of claim 1, wherein the bottom hole assembly has a plurality of fatigue susceptible features, and further comprising identifying, using the terminal, at least one of the plurality of fatigue susceptible features having a shortest remaining fatigue life.

5. The method of claim 1 further comprising tracking the cumulative fatigue damage of the fatigue susceptible feature during a subsequent use in a second wellbore.

6. The method of claim 1, further comprising performing a corrective action in response to the determination of the fatigue damage to increase fatigue life.

7. The method of claim 6 wherein the corrective action is adjustment of at least one of weight on bit, weight on one of the drill collars, torque on bit, torque on one of the drill collars, wellbore pressure, rotation speed of the bottom hole assembly, and wellbore trajectory.

8. The method of claim 1 wherein the fatigue susceptible feature of the bottom hole assembly is at least one of a dimensional change, a port hole, and a threaded connection between two components of the bottom hole assembly.

9. A system for fatigue analysis of a bottom hole assembly ("BHA") comprised of a plurality of drill collars connected by threaded connections, the system comprising:
   sensors that obtain measurements during drilling operations wherein the sensors are mechanically connected to the BHA; and
   a terminal communicatively connected to the sensors to receive the measurements from the sensors wherein the terminal determines a cumulative fatigue damage for each of the drill collars and each of the threaded connections based on the measurements and further wherein the terminal performs an adjustment of the drilling operations in response to the cumulative fatigue damage.

10. The system of claim 9, wherein the adjustment of the drilling operations is an adjustment of at least one of a weight on bit, a torque on bit, a pressure and a revolutions per minute.

11. The system of claim 9, wherein the adjustment of the drilling operations is at least one of a recut in one or more of the drill collars and addition of a residual compressive stress to one or more of the drill collars.

12. The system of claim 9, wherein the cumulative fatigue damage is determined by summing a fatigue damage of each of the drill collars at each dog-leg severity of a wellbore.

13. A method for fatigue analysis of a bottom hole assembly ("BHA") comprised of a plurality of drill collars threadedly connected, the method comprising:
   applying, using a computer processor, a plurality of loading conditions to finite element models for the drill collars and the threaded connections;
   predicting, using the computer processor, stress and strain states for fatigue susceptible features of a selected drill collar of the drill collars;
   modifying, using the computer processor, a configuration of the BHA based on the stress and strain states predicted to minimize fatigue damage;
   determining, using the computer processor, fatigue damage of the fatigue susceptible feature at each dog-leg severity of a wellbore; and
   determining, using the computer processor, the cumulative fatigue damage of the fatigue susceptible feature by summing the fatigue damage at each dog-leg severity.

14. The method of claim 13, further comprising determining, using the computer processor, a relationship between bending moment and fatigue life for each of the drill collars and the threaded connections.

15. The method of claim 13, wherein the modifying the configuration of the BHA includes adjusting locations of the fatigue susceptible features in the BHA based on the stress and strain states.

16. The method of claim 13, further comprising generating, using the computer processor, a one-dimensional model of the BHA wherein the model has a plurality of beams and each of the plurality of beams represents a section of the BHA having substantially invariable bending stiffness and further wherein the model is used to apply the plurality of loading conditions to the finite element models.

17. The method of claim 13, further comprising identifying, using the computer terminal, one or more components of the BHA having a shorter estimated fatigue life than other components of the BHA, wherein the one or more components are identified based on predicted stress and strain states determined from a well plan.

18. The method of claim 13, further comprising determining, using the computer terminal, a fatigue damage of each of the fatigue susceptible features per revolution at each dog-leg severity.

* * * * *